(12) United States Patent
Nelson

(10) Patent No.: US 7,643,580 B2
(45) Date of Patent: Jan. 5, 2010

(54) SIGNAL GENERATOR CIRCUIT HAVING MULTIPLE OUTPUT FREQUENCIES

(75) Inventor: Dale H. Nelson, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 588 days.

(21) Appl. No.: 11/478,746

(22) Filed: Jun. 30, 2006

(65) Prior Publication Data

US 2008/0002799 A1    Jan. 3, 2008

(51) Int. Cl.
*H03D 3/18* (2006.01)
(52) U.S. Cl. ...................................................... 375/327
(58) Field of Classification Search ................. 375/327, 375/294, 371, 376; 327/117, 147, 156; 329/325, 329/360
See application file for complete search history.

(56) References Cited

U.S. PATENT DOCUMENTS

2003/0198311 A1* 10/2003 Song et al. ................... 375/376
2004/0180638 A1*  9/2004 Craninckx ............... 455/180.3
2006/0132200 A1*  6/2006 Dietl ........................... 327/117

* cited by examiner

*Primary Examiner*—Khai Tran
(74) *Attorney, Agent, or Firm*—Ryan, Mason & Lewis, LLP

(57) ABSTRACT

A signal generator circuit includes an oscillator operative to generate a first signal having a first frequency associated therewith, and a phase stepper circuit coupled to the oscillator. The phase stepper circuit is configured to receive a plurality of control signals indicative of respective phases of the first signal, and to generate a second signal as a function of the plurality of control signals. The second signal has a second frequency associated therewith that is a fractional multiple or a fractional division of the first frequency. The second signal has a phase associated therewith which changes with periods of the second signal.

18 Claims, 3 Drawing Sheets

SIGNAL GENERATOR CIRCUIT HAVING MULTIPLE OUTPUT FREQUENCIES

FIELD OF THE INVENTION

The present invention relates generally to the field of electronic circuits, and more particularly relates to signal generator circuits.

BACKGROUND OF THE INVENTION

In phase-locked loops (PLLs) and other applications, it is sometimes necessary to provide clock signals, or other timing signals, of different frequencies. For applications in which power is an issue, using a high frequency clock that is a multiple of a certain desired clock frequency would be either too power intensive or not even possible using modern integrated circuit (IC) technology.

By way of example, consider the case of generating a desired 36.864 megahertz (MHz) clock from a 30 MHz reference clock. One way to achieve this is to use a PLL having a phase detector and voltage-controlled oscillator (VCO) where the 30 MHz reference clock is divided by 625 to obtain a 48 kilohertz (KHz) phase detector rate. The output of the VCO could then be multiplied by 768 to obtain the desired 36.864 MHz clock. However, this approach would result in poor jitter performance. Moreover, using a conventional PLL, a large loop filter is required or otherwise external components are needed to implement the loop filter, either of which could be costly.

The phase detector rate can be increased, thereby improving jitter performance of the PLL, by increasing the VCO output frequency to 184.32 MHz, five times the desired clock rate of 36.864 MHz. The 30 MHz reference clock is divided by 125 to obtain a 240 KHz phase detector rate. The output of the VCO would still need to be multiplied by 768 to obtain the 184.32 MHz clock. However, while jitter performance would be improved compared to the PLL arrangement in the previous example, power consumption would be increased since the VCO must run five times faster. To further increase the phase detector rate, the VCO could be potentially run at 921.6 MHz, with a divide value of 20 to obtain the desired 36.864 MHz clock rate. This would allow a phase detector rate of 1.2 MHz. Unfortunately, however, this would undesirably increase power consumption and, in some slower technologies, may not even be possible.

There exists a need, therefore, for an improved signal generator circuit that does not suffer from one or more of the problems exhibited by conventional signal generator arrangements.

SUMMARY OF THE INVENTION

The present invention meets the above-noted need by providing, in illustrative embodiments thereof, techniques for advantageously improving the performance of a signal generator circuit by generating a plurality of output signals, including a first signal having a primary frequency associated therewith and at least a second signal having a secondary frequency associated therewith which is not a simple division or a simple multiple of the primary frequency. In this manner, illustrative embodiments of the invention provide a good compromise between power consumption and phase detector rate to improve jitter performance, among other benefits.

In accordance with one aspect of the invention, a signal generator circuit includes an oscillator operative to generate a first signal having a first frequency associated therewith, and a phase stepper circuit coupled to the oscillator. The phase stepper circuit is configured to receive a plurality of control signals indicative of respective phases of the first signal, and to generate a second signal as a function of the plurality of control signals. The second signal has a second frequency associated therewith that is a fractional multiple or a fractional division of the first frequency. The second signal has a phase associated therewith which changes with periods of the second signal.

The phase stepper circuit is configured, in an illustrative embodiment of the invention, to switch a phase of the second signal when a first one of the phase signals and a second one of the phase signals are at a same logic value, the first one of the phase signals representing a current phase of the second signal and the second one of the phase signals representing a next intended phase of the second signal.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative embodiments of an oscillator circuit. It should be understood, however, that the present invention is not limited to the particular circuit arrangements of the illustrative embodiments shown. Rather, the present invention provides techniques for advantageously improving the performance of a signal generator circuit by, in one aspect, generating a plurality of output signals including a first signal having a primary frequency associated therewith and at least a second signal having a secondary frequency associated therewith which is not a simple division or a simple multiple of the primary frequency. The signal generator circuit formed in accordance with embodiments of the present invention is particularly well-suited for use in a wide variety of integrated circuit applications, as well as in non-integrated circuit applications.

Figure 1:
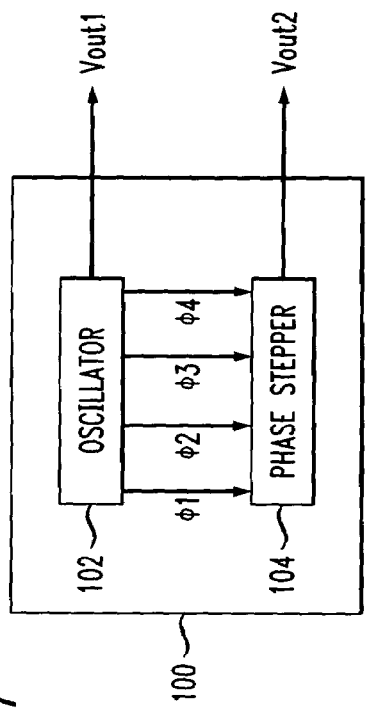
FIG. 1 is a block diagram depicting an exemplary signal generator circuit, formed in accordance with an embodiment of the invention.

FIG. 1 is a block diagram illustrating at least a portion of an exemplary signal generator circuit 100 in which techniques of the present invention are implemented. The signal generator circuit 100 is preferably operable in a radio frequency (RF) frequency range (e.g., greater than about 350 MHz), although the invention is not limited to any particular frequency range of operation. Without loss of generality but for ease of explanation, the signal generator circuit 100 will be described in terms of functional blocks, including an oscillator 102 and a phase stepper circuit 104. Although shown as separate functional blocks, at least a portion of one or more of the blocks in the signal generator circuit 100 may be combined and/or integrated either with each other, or with one or more other functional blocks, and certain portions of the combined functional blocks may be shared, as will be understood by those skilled in the art. For example, portions of the oscillator 102 may be implemented in the phase stepper circuit 104, or vice versa, or both the oscillator 102 and the phase stepper circuit 104 may be implemented as a single functional block. A more detailed description of the functional blocks in the signal generator circuit 100 is presented below.

The oscillator 102 is preferably operative to generate a first signal, Vout1, having a first (e.g., primary) frequency associated therewith. The oscillator 102 is also preferably operative to generate a plurality of different phases, φ1, φ2, φ3 and φ4, of the first signal Vout1. Each of the phases φ1 through φ4 generated by the oscillator 102 is preferably separated by a prescribed amount (e.g., ninety degrees), such that the phases φ1, φ2, φ3, φ4 have a prescribed time relation with respect to one another. It is to be understood that the present invention is not limited to the illustrative number of phases shown, and that a higher number of phases (e.g., five) or a lower number of phases (e.g., three) generated by the oscillator 102 is similarly contemplated by the invention. Nor is the invention limited to any particular amount of phase separation between respective phases of the oscillator 102. Moreover, the prescribed amount of separation between adjacent phases need not be the same. The amount of phase separation between respective phases of the oscillator 102 is preferably chosen such that any given phase overlaps at least one of the other phases. This overlap of the various phases ensures that a current phase and a next adjacent phase are both high for part of the time and both low for part of the time so that a switch to the next adjacent phase can occur without creating a "glitch" or other discontinuity in the output signal.

The phase stepper circuit 104 is preferably operative to receive a plurality of control signals and to generate a second signal, Vout2, as a function of the plurality of control signals, the second signal having a second frequency associated therewith that is a fractional multiple or a fractional division of the first frequency. The control signals presented to the phase stepper circuit 104 are preferably either the respective phases φ1, φ2, φ3, φ4 of the first signal Vout1 generated by the oscillator 102, as shown, or are indicative of the plurality of respective phases φ1, φ2, φ3, φ4 (e.g., buffered versions of φ1, φ2, φ3, φ4). The phase stepper circuit 104 functions essentially as a multiplexer which selects which phase of the oscillator 102 to use at any given time in generating the second signal Vout2. The second signal Vout2 has a phase associated therewith that changes with every period of Vout2, and thus signal Vout2 resembles a pointer which circulates through the phases generated by the oscillator 102 in a prescribed pattern. Furthermore, the phase stepper circuit 104 is preferably configured such that a change between phases takes place when both the current phase and the intended next phase are at the same logic level so as to substantially eliminate any discontinuities (e.g., glitches) in the second signal Vout2.

Figure 2:
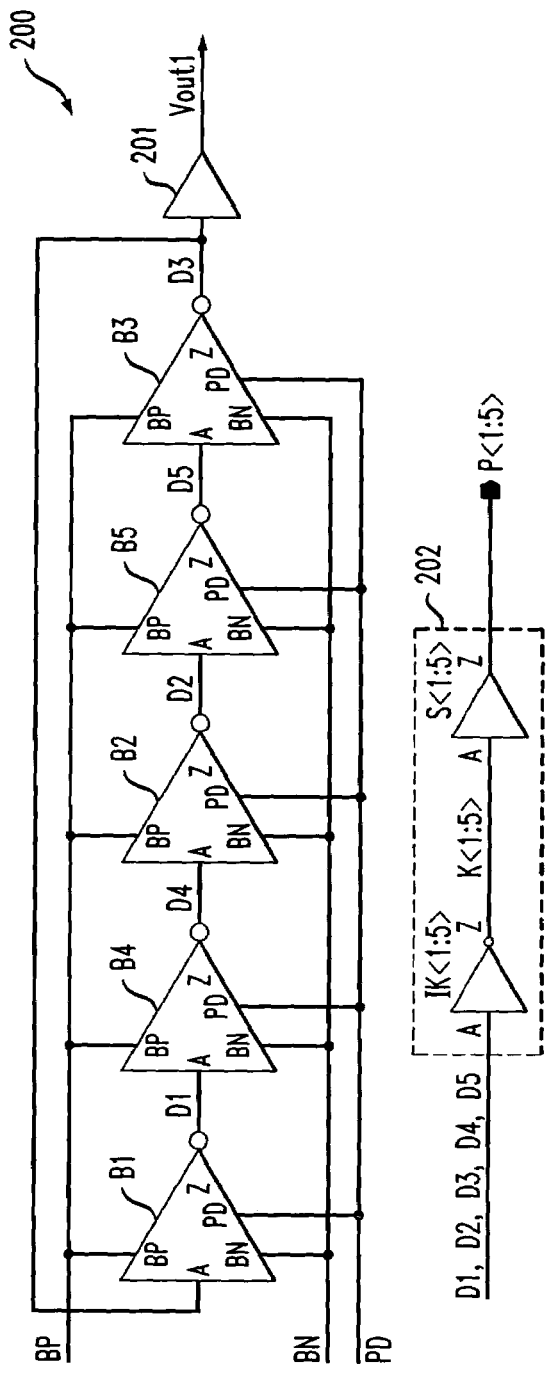
FIG. 2 is a schematic diagram depicting at least a portion of an exemplary oscillator suitable for use in the signal generator circuit shown in FIG. 1, in accordance with an embodiment of the invention.

FIG. 2 is a schematic diagram depicting at least a portion of an exemplary oscillator 200 suitable for use in the illustrative signal generator circuit 100 shown in FIG. 1. The oscillator 200 includes five delay stages, B1 through B5, connected together in a ring configuration as shown, with an output of one delay stage (e.g., B1) connected to an input of a successive delay stage (e.g., B4), and so forth until the ring is closed. The delay stages are preferably inverting delay stages. It is to be understood that the oscillator 200 is not limited to the particular number and/or type of delay stages shown in the illustrative embodiment thereof, although the ring preferably comprises an odd number of inversions in order to provide positive feedback for sustaining oscillation.

Specifically, an output of delay stage B1 is connected to an input of delay stage B4, an output of delay stage B4 is connected to an input of delay stage B2, an output of delay stage B2 is connected to an input of delay stage B5, an output of delay stage B5 is connected to an input of delay stage B3, and an output of delay stage B3 is connected to an input of delay stage B1 to close the loop. Signal D1 is generated at the output of delay stage B1, signal D4 is generated at the output of delay stage B4, signal D2 is generated at the output of delay stage B2, signal D5 is generated at the output of delay stage B5, and signal D3 is generated at the output of delay stage B3. An output signal, Vout1, generated by the oscillator 200 is preferably a buffered version of signal D3, such as, for example, by employing a buffer 201 having an input connected to the output of delay stage B3, although any of the respective signals generated by the delay stages may be used as an output of the oscillator. The stages are numbered in the seemingly odd order shown so that the output phases of D1 to D5 will appear in the proper order.

The delay associated with a given delay stage will be a function of the cumulative delays of all of the delay stages in the chain from a first delay stage (e.g., B1) to and including the given delay stage. Thus, the delay of signal D5 generated at the output of delay stage B5 will be a function of a sum of the respective delays of delay stages B1, B4, B2 and B5. Although it is preferred that the respective delays of the delay stages B1 through B5 in oscillator 200 are substantially the same, two or more of the delay stages may, alternatively, have a different delay relative to one another. When employing delay stages having different delays relative to one another, the amount of phase separation between adjacent phase signals will be nonlinear.

Each of the delay stages B1 through B5 is connected to a first bias source, BP, and a second bias source, BN. First and second bias sources BP and BN preferably serve as a positive and negative voltage supply, respectively, for the delay stages. Each of the delay stages preferably includes a control input for receiving a control signal, PD, supplied thereto. Control signal PD may be employed to selectively disable the oscillator 200, for example, by placing the respective outputs of the delay stages D1 through D5 in a high-impedance state. This may be beneficial, for instance, in a power down mode of operation. Bias signals BP and BN, as well as control signal PD, may be generated externally and supplied to the oscillator 200 (e.g., by a reference circuit). Alternatively, one or more of these signals BP, BN, PD may be generated internally to the oscillator 200.

The respective delays of the delay stages may be controlled as a function of a voltage level of the first bias source BP and/or the second bias source BN. By controlling the respective delays of the delay stages, a frequency of the output signal Vout1 generated by the oscillator 200 can be selectively controlled. It is to be appreciated that various alternative methodologies are contemplated for selectively controlling the delay of a given delay stage, such as, for example, by controlling a drive strength of the delay stage based at least in part on a control signal presented thereto, or by changing a capacitive loading at the input of each delay stage, as will be understood by those skilled in the art. It is to be appreciated that, in accordance with another embodiment of the invention (not shown), the oscillator 200 may employ delay stages having a fixed delay associated therewith, and the number of delay stages in the ring may be selectively varied as a means of controlling the frequency of the oscillator output signal Vout1.

The oscillator 200 may further include a buffer circuit 202. Buffer circuit 202 is preferably operative to receive the signals D1 through D5 generated by the delay stages B1 through B5, respectively, and to generate corresponding output phase signals, P1 through P5 (referred to collectively as P<1:5>). Output phase signals P<1:5> are indicative of a phase of corresponding signals D1 through D5 relative to one another. Since phase signals P1 through P5 are buffered, any loading (e.g., capacitive or otherwise) experienced by signals P<1:5> will not significantly affect the frequency of the oscillator 200. As apparent from the figure, buffer circuit 202 may comprise, for each signal D1 through D5, an inverter, IK1 through IK5 (referred to collectively as IK<1:5>), respectively, and a buffer, S1 through S5 (referred to collectively as S<1:5>), respectively, connected to a corresponding inverter. Specifically, an input of inverter IK1 preferably receives signal D1 generated by delay stage B1, an output of inverter IK1 is connected to an input of buffer S1, and an output of buffer S1 generates output phase signal P1. Likewise, an input of inverter IK2 preferably receives signal D2 generated by delay stage B2, an output of inverter IK2 is connected to an input of buffer S2, and an output of buffer S2 generates output phase signal P2. An input of inverter IK3 preferably receives signal D3 generated by delay stage B3, an output of inverter IK3 is connected to an input of buffer S3, and an output of buffer S3 generates output phase signal P3. An input of inverter IK4 preferably receives signal D4 generated by delay stage B4, an output of inverter IK4 is connected to an input of buffer S4, and an output of buffer S4 generates output phase signal P4. An input of inverter IK5 preferably receives signal D5 generated by delay stage B5, an output of inverter IK5 is connected to an input of buffer S5, and an output of buffer S5 generates output phase signal P5.

Figure 3:
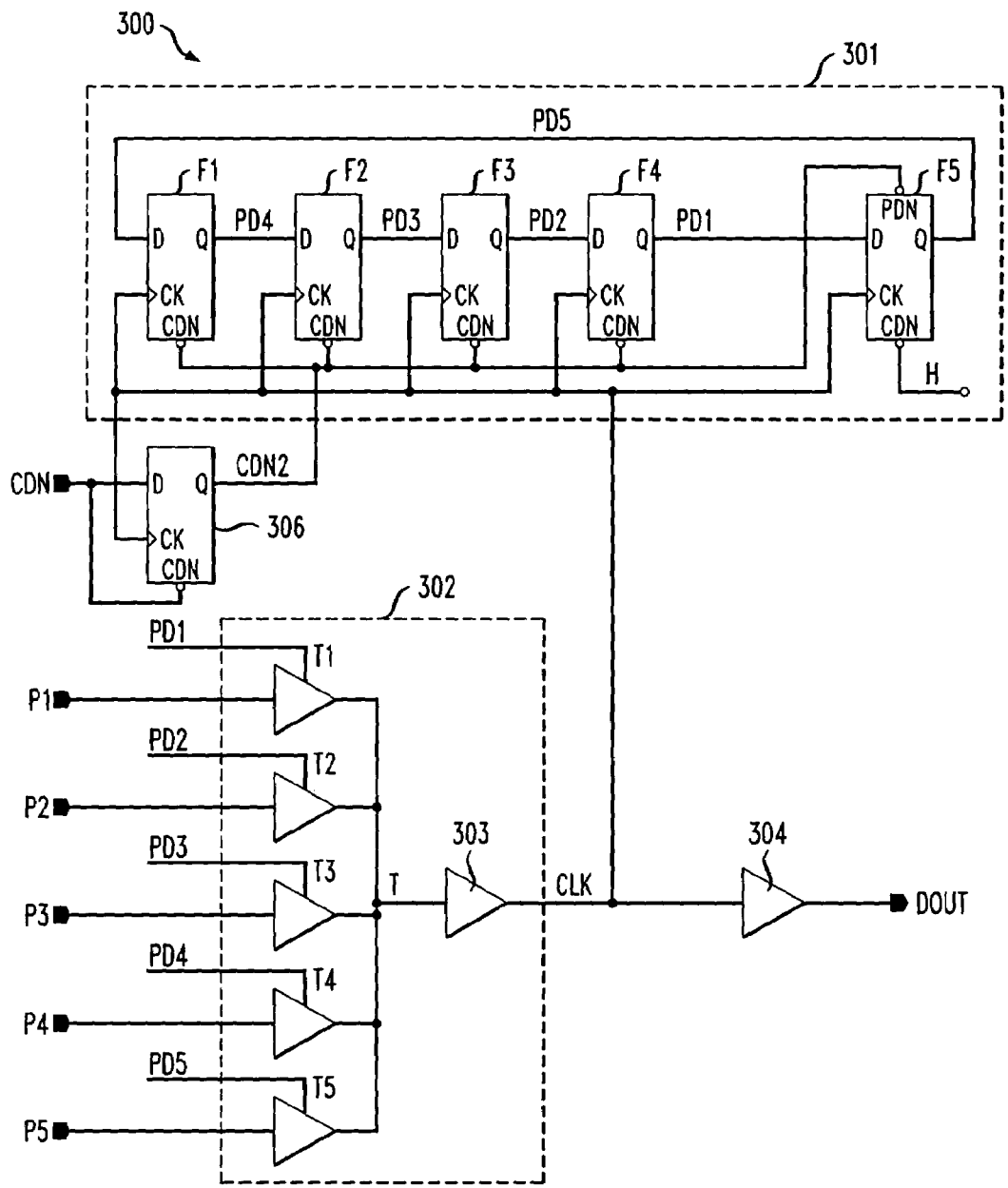
FIG. 3 is a schematic diagram depicting at least a portion of an exemplary phase stepper circuit suitable for use in the signal generator circuit shown in FIG. 1, in accordance with an embodiment of the invention.

With reference now to FIG. 3, at least a portion of an exemplary phase stepper circuit 300 is shown which is suitable for use in the illustrative signal generator circuit 100 of FIG. 1. The phase stepper circuit 300 comprises a counter 301 and selection circuitry 302 coupled to the counter for generating a clock signal, CLK. The counter 301, which will be described in further detail below, preferably includes a plurality of D-type flip-flops (DFFs), F1, F2, F3, F4 and F5, although alternative counting circuitry may be employed. The number of DFFs in the counter 301 is preferably matched to the number of delay stages in the oscillator 200 (FIG. 2). As previously stated, the invention is not limited to any particular number of delay stages in the oscillator, and therefore is not limited to any particular number of DFFs in the counter. Phase stepper circuit 300 may further include a buffer 304, or alternative buffering circuitry, for generating an output signal, DOUT, of the phase stepper circuit as a buffered version of clock signal CLK.

The selection circuitry 302 is operative to receive a plurality of phase signals P1, P2, P3, P4 and P5, generated by the oscillator 200 (FIG. 2) and to select which one of the phase signals to output at any given time based at least in part on one or more control signals, PD1, PD2, PD3, PD4 and PD5, presented to the selection circuitry. The selection circuitry 302 preferably comprises a plurality of tri-state buffers, T1, T2, T3, T4 and T5, although alternative circuit arrangements are similarly contemplated by the invention (e.g., multiplexer, etc.). The number of tri-state buffers in the selection circuitry 302 is at least equal to the number of phase signals generated by the oscillator (e.g., five). The tri-state buffers may be non-inverting, as shown, or inverting. Each of the tri-state buffers T1, T2, T3, T4, and T5 receives, at an input thereof, a corresponding one of the phase signals P1, P2, P3, P4, P5, respectively, and an output of each of the tri-state buffers is connected together at a common node, T. Preferably, only one of the control signals PD1, PD2, PD3, PD4, and PD5 is active at any given time, and thus only one of the tri-state buffers will be enabled at any given time thereby avoiding output contention problems which may otherwise occur among the tri-state buffers. The output signal at node T may be passed through a buffer 303, or alternative buffering arrangement, to provide clock signal CLK as a buffered version of the selected phase signal.

Counter 301 is operative to generate the control signals PD1 through PD5 used to select which one of the phase signals P1 through P5, respectively, to output as clock signal CLK. DFFs F1, F2, F3, F4, and F5 in counter 301 are preferably configured as a binary counter. An output (Q) of a given DFF is connected to a data input (D) of a succeeding DFF. Specifically, an output of F1 is connected to a data input of F2, an output of F2 is connected to a data input of F3, an output of F3 is connected to a data input of F4, an output of F4 is connected to a data input of F5, and an output of F5 is connected to a data input of F1. Control signals PD1, PD2, PD3, PD4 and PD5 are generated at the outputs of DFFs F4, F3, F2, F1 and F5, respectively. Clock signal CLK generated by the select circuitry 302 is presented to a clock input (CK) of each DFF F1, F2, F3, F4, F5 and is used as a timing signal for the DFFs.

Counter 301 is operative as a phase selection pointer which selects a different phase signal every period of the derived output signal DOUT. Moreover, the switching between phase signals is performed, in accordance with techniques of the invention, when both the current phase signal and the next intended phase signal are at the same logic level, as previously stated. In this manner, discontinuities in the derived output signal DOUT are essentially eliminated. With the phase stepper circuit 300 configured as shown (e.g., having five counter stages), the output signal DOUT will have a frequency associated therewith which is 1.25 times the frequency of the output signal Vout1 generated by the oscillator 200 (FIG. 2). For a phase stepper circuit employing n counter stages, output signal DOUT will preferably have a frequency which is $$\frac{n}{n-1}$$

times the frequency of the output signal Vout1 generated by the oscillator. With a slight modification to the counter in the phase stepper circuit, the output signal DOUT can be made to have a frequency which is $$\frac{n+1}{n}$$

times the frequency of the output signal Vout1 generated by the oscillator, where again n represents the number of counter stages employed. Thus, signal DOUT generated by phase stepper circuit 300, employing five counter stages (e.g., n=5), may have a frequency which is either 1.25 or 1.20 times the frequency of the signal Vout1 generated by the oscillator 200.

A DFF 306, or alternative initialization circuit, is preferably employed to reset DFFs F1, F2, F3 and F4 to a known logic state. DFF 306 is clocked by signal CLK. A reset input (CDN) and a data input of DFF 306 are connected together and receive a reset signal, CDN, presented to the phase stepper circuit 300. When reset signal CDN is a logic low level (e.g., "0"), an output of DFF 306 will be a logic low level. The output from DFF 306 is connected to reset inputs of DFFs F1, F2, F3 and F4 to thereby set the respective outputs of these DFFs to a logic low level. A reset input of DFF F5 is preferably connected to a logic high signal (H) and therefore F5 is not reset in the same manner as preceding DFFs F1, F2, F3, and F4.

Figure 4:
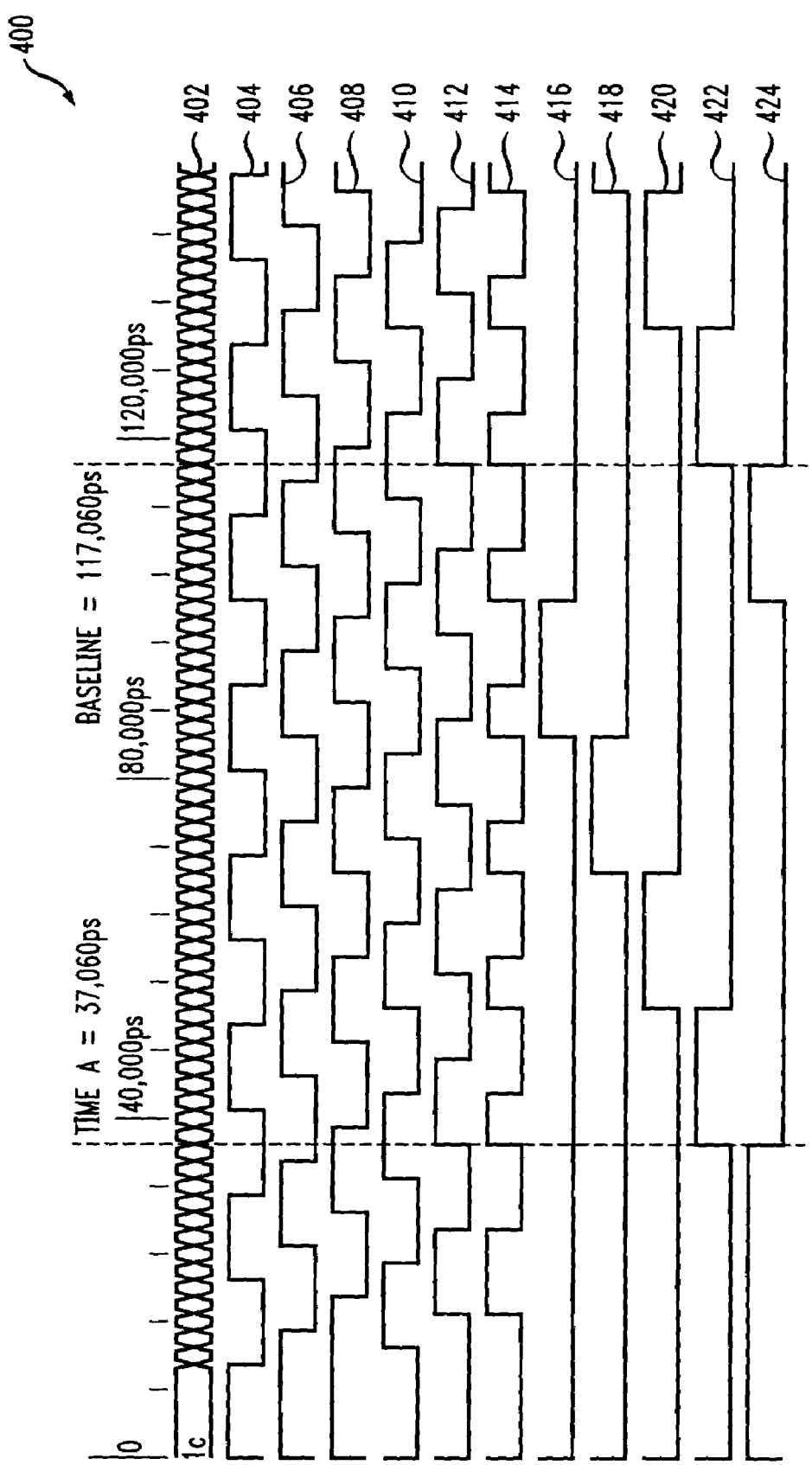
FIG. 4 is a logic timing diagram depicting exemplary signals associated with the oscillator shown in FIG. 2 and the phase stepper circuit shown in FIG. 3, accordance with an aspect of the invention.

FIG. 4 is a logical timing diagram 400 depicting exemplary signals associated with the oscillator 200 shown in FIG. 2 and with the phase stepper circuit 300 shown in FIG. 3, in accordance with aspects of the invention. Timing diagram 400 includes high speed clock 402 which may be an exclusive-OR of the phase signals P1 through P5, phase signal P1 404, phase signal P2 406, phase signal P3 408, phase signal P4 410, phase signal P5 412, phase stepper output signal DOUT 414, control PD1 416, control PD2 418, control PD3 420, control PD4 422, and control PD5 424. As apparent from the figure, for every four periods of the phase signals P1 through P5 generated by the oscillator 200 (FIG. 2) (e.g., over a duration of 80 nanoseconds), there are five periods of signal DOUT 414 generated by the phase stepper circuit 300 (FIG. 3). As previously explained, the invention is not limited to the particular circuit arrangements shown.

At least a portion of the signal generation methodologies of the present invention may be implemented in one or more integrated circuits. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A signal generator circuit, comprising:
an oscillator operative to generate at least a first signal having a first frequency associated therewith; and
a phase stepper circuit coupled to the oscillator, the phase stepper circuit being configured to receive a plurality of phase signals indicative of respective phases of the first signal, and to generate a second signal as a function of the plurality of phase signals, the second signal having a second frequency associated therewith that is one of a fractional multiple and a fractional division of the first frequency, the second signal having a phase associated therewith which changes with periods of the second signal;
wherein the second frequency is substantially equal to one of $$\frac{n+1}{n} \text{ and } \frac{n}{n-1}$$

times the first frequency, where n is an integer indicative of a number of delay stages in the oscillator.

2. A signal generator circuit, comprising:
an oscillator operative to generate at least a first signal having a first frequency associated therewith; and
a phase stepper circuit coupled to the oscillator, the phase stepper circuit being configured to receive a plurality of phase signals indicative of respective phases of the first signal, and to generate a second signal as a function of the plurality of phase signals, the second signal having a second frequency associated therewith that is one of a fractional multiple and a fractional division of the first frequency, the second signal having a phase associated therewith which changes with periods of the second signal;
wherein the phase stepper circuit is configured to switch a phase of the second signal when a first one of the phase signals and a second one of the phase signals are at a same logic value, the first one of the phase signals representing a current phase of the second signal and the second one of the phase signals representing a next intended phase of the second signal.

3. A signal generator circuit, comprising:
an oscillator operative to generate at least a first signal having a first frequency associated therewith; and
a phase stepper circuit coupled to the oscillator, the phase stepper circuit being configured to receive a plurality of phase signals indicative of respective phases of the first signal, and to generate a second signal as a function of the plurality of phase signals, the second signal having a second frequency associated therewith that is one of a fractional multiple and a fractional division of the first frequency, the second signal having a phase associated therewith which changes with periods of the second signal;
wherein the oscillator comprises a plurality of delay stages including first and last stages, the plurality of delay stages being connected in a ring configuration, such that an output of a given delay stage is coupled to an input of a successive delay stage, the output of the last stage being coupled to an input of the first stage, wherein the first frequency is controlled as a function of at least one bias signal supplied to the plurality of delay stages in the oscillator.

4. The circuit of claim 3, wherein the first frequency is controlled as a function of respective delays of the plurality of delay stages in the oscillator.

5. The circuit of claim 3, wherein the first frequency is controlled as a function of capacitive loading at respective inputs of the plurality of delay stages in the oscillator.

6. The circuit of claim 3, wherein each of the plurality of phase signals supplied to the phase stepper circuit is generated at an output of a corresponding one of the plurality of delay stages in the oscillator.

7. The circuit of claim 3, wherein the oscillator comprises a buffer circuit, the buffer circuit having an input connected to the output of one of the plurality of delay stages and having an output for generating the first signal.

8. A signal generator circuit, comprising:
an oscillator operative to generate at least a first signal having a first frequency associated therewith; and
a phase stepper circuit coupled to the oscillator, the phase stepper circuit being configured to receive a plurality of phase signals indicative of respective phases of the first signal, and to generate a second signal as a function of the plurality of phase signals, the second signal having a second frequency associated therewith that is one of a fractional multiple and a fractional division of the first frequency, the second signal having a phase associated therewith which changes with periods of the second signal;

wherein the phase stepper circuit comprises:
  selection circuitry operative to receive the plurality of phase signals and a plurality of control signals, the selection circuitry being operative to generate an output signal indicative of one of the plurality of phase signals as a function of the plurality of control signals; and
  a counter connected to the selection circuitry, the counter including a plurality of stages, each of the stages being clocked as a function of the output signal from the selection circuitry, the counter being operative to generate the plurality of control signals, each of the control signals being generated at an output of a corresponding one of the counter stages.

9. The circuit of claim 8, wherein the selection circuitry comprises a plurality of tri-state buffers, a number of tri-state buffers in the selection circuitry being at least equal to a number of phase signals generated by the oscillator, each of the tri-state buffers including a first input for receiving a corresponding one of the phase signals, a second input for receiving a corresponding one of the plurality of control signals, and an output, the respective outputs of the tri-state buffers being connected together and generating the output signal of the selection circuitry.

10. The circuit of claim 9, wherein the selection circuitry is configured such that a single tri-state buffer is enabled at any given time as a function of the plurality of control signals supplied to the selection circuitry.

11. The circuit of claim 8, wherein the selection circuitry comprises a multiplexer including a plurality of first inputs for receiving respective phase signals generated by the oscillator, a plurality of second inputs for receiving respective control signals generated by the counter, and an output for generating the output signal of the selection circuitry as a function of the control signals.

12. The circuit of claim 8, wherein the counter comprises a plurality of D-type flip-flops (DFFs) including a first DFF and a last DFF, the plurality of DFFs being connected in a ring configuration, such that an output of a given DFF is coupled to a data input of a successive DFF, the output of the last DFF being coupled to the input of the first DFF, each of the DFFs including a clock input, the respective clock inputs being connected together and receiving the output signal generated by the selection circuitry, each of the control signals being generated at the output of a corresponding one of the DFFs.

13. The circuit of claim 8, wherein the counter comprises a binary counter.

14. The circuit of claim 8, wherein the phase stepper circuit further comprises a reset circuit connected to the counter, the reset circuit selectively setting the counter to a prescribed logic state.

15. An integrated circuit including at least one signal generator circuit, the at least one signal generator circuit comprising:
  an oscillator operative to generate a first signal having a first frequency associated therewith; and
  a phase stepper circuit coupled to the oscillator, the phase stepper circuit being configured to receive a plurality of phase signals indicative of a plurality of respective phases of the first signal, and to generate a second signal as a function of the plurality of phase signals, the second signal having a second frequency associated therewith that is one of a fractional multiple and a fractional division of the first frequency, the second signal having a phase associated therewith which changes with every period of the second signal;
  wherein the second frequency is substantially equal to one of $$\frac{n+1}{n} \text{ and } \frac{n}{n-1}$$

times the first frequency, where n is an integer indicative of a number of delay stages in the oscillator.

16. The integrated circuit of claim 15, wherein the phase stepper circuit comprises:
  selection circuitry operative to receive the plurality of phase signals and a plurality of control signals, the selection circuitry being operative to generate an output signal indicative of one of the plurality of phase signals as a function of the plurality of control signals; and
  a counter connected to the selection circuitry, the counter including a plurality of stages, each of the stages being clocked as a function of the output of the selection circuitry, the counter being operative to generate the plurality of control signals, each of the control signals being generated at an output of a corresponding one of the counter stages.

17. An integrated circuit including at least one signal generator circuit, the at least one signal generator circuit comprising:
  an oscillator operative to generate a first signal having a first frequency associated therewith; and
  a phase stepper circuit coupled to the oscillator, the phase stepper circuit being configured to receive a plurality of phase signals indicative of a plurality of respective phases of the first signal, and to generate a second signal as a function of the plurality of phase signals, the second signal having a second frequency associated therewith that is one of a fractional multiple and a fractional division of the first frequency, the second signal having a phase associated therewith which changes with every period of the second signal;
  wherein the phase stepper circuit is configured to switch a phase of the second signal when a first one of the phase signals and a second one of the phase signals are at a same logic value, the first one of the phase signals representing a current phase of the second signal and the second one of the phase signals representing a next intended phase of the second signal.

18. A signal generator circuit generating multiple signals having different respective frequencies associated therewith, the signal generator circuit comprising:
  an oscillator operative to generate a first signal having a first frequency associated therewith; and
  a multiplexer connected to the oscillator and being operative to receive a plurality of phase signals indicative of respective phases of the first signal, and to generate a second signal by selecting one of the plurality of phase signals as a function of one or more control signals, the second signal having a second frequency associated therewith that is a fractional multiple or a fractional division of the first frequency, the second signal having a phase associated therewith which changes with every period of the second signal;
  wherein the second frequency is substantially equal to one of $$\frac{n+1}{n} \text{ and } \frac{n}{n-1}$$

times the first frequency, where n is an integer indicative of a number of delay stages in the oscillator.

* * * * *